United States Patent [19]

Erdelen et al.

[11] Patent Number: 5,258,262
[45] Date of Patent: Nov. 2, 1993

[54] RADIATION-SENSITIVE FILM COMPOSED OF AT LEAST ONE MONO-MOLECULAR LAYER OF FLUORINE-CONTAINING AMPHIPHILES

[75] Inventors: Christian Erdelen, Wiesbaden; Helmut Ringsdorf; Werner Prass, both of Mainz; Ude Scheunemann, Liederbach, all of Fed. Rep. of Germany

[73] Assignee: Hoechst Aktiengesellschaft, Frankfurt am Main, Fed. Rep. of Germany

[21] Appl. No.: 730,835
[22] PCT Filed: Jan. 12, 1990
[86] PCT No.: PCT/EP90/00069
   § 371 Date: Sep. 13, 1991
   § 102(e) Date: Sep. 13, 1991
[87] PCT Pub. No.: WO90/08346
   PCT Pub. Date: Jul. 26, 1990

[30] Foreign Application Priority Data

Jan. 14, 1989 [DE] Fed. Rep. of Germany ....... 3901003

[51] Int. Cl.$^5$ .............. G03C 1/76; G03C 1/492; G03F 7/095; G03F 7/16
[52] U.S. Cl. .................... 430/273; 430/280; 430/296; 430/325; 430/327; 430/935; 430/942; 428/333; 428/421; 427/430.1; 427/434.3
[58] Field of Search ................ 428/333, 421; 427/430.1, 434.3; 430/296, 280, 325, 327, 942, 935, 273

[56] References Cited

U.S. PATENT DOCUMENTS

| | | | |
|---|---|---|---|
| 3,910,187 | 10/1975 | Cords | 101/450 |
| 4,696,838 | 9/1987 | Miyata et al. | 427/430.1 |
| 4,960,635 | 10/1990 | Erdelen et al. | 428/220 |
| 5,006,410 | 4/1991 | Vogel Viola et al. | 428/421 |
| 5,120,603 | 6/1992 | Schmidt | 427/430.1 |

FOREIGN PATENT DOCUMENTS 069978 1/1983 European Pat. Off. .
0300419 7/1988 European Pat. Off. .

OTHER PUBLICATIONS

T. Kitayama, Journal of Electronic Engineering, vol. 22, No. 225, 32-36 (Sep. 1985) "Lithographic Reproduction Technology Focuses on Submicron Chip Patterns".
M. Sugi, Journal of Molecular Electronics, vol. 1, 3-17 (Jul./Sep. 1985) "Langmuir-Blodgett Films-A Course Towards Molecular Electronics: A Review".
Boothroyd et al., British Polymer Journal, vol. 17, No. 4, 360-363 (1985), "Electron Irradiation of Polymerisable Langmuir-Blodgett Multilayers as Model Resists for Electron-beam Lithography".
Laschewsky et al., J. Am. Chem. Soc. 1987, 109, 788-796, "Self-Organization of Polymeric Lipids with Hydrophilic Spacers in Side Groups and Main Chain: Investigation in Monolayers and Multilayers".

Primary Examiner—Marion E. McCamish
Assistant Examiner—Janis L. Dote
Attorney, Agent, or Firm—Curtis, Morris & Safford

[57] ABSTRACT

Radiation-sensitive film composed of at least one monomolecular layer of fluorine-containing amphiphiles. If a vinyl monomer containing fluoroalkyl side groups is copolymerized with a vinyl monomer containing oxirane groups, an amphiphilic polymer is obtained. To prepare a sandwich, a polymer is dissolved in a volatile organic solvent which is immiscible with water, the solution is spread on the water/air boundary surface, the resultant layer is compressed after the solvent has evaporated and transferred to a solid layer support by the Langmuir-Blodgett technique. The oxirane rings are cleaved and the film crosslinked by the action of high-energy radiation on the film.

7 Claims, No Drawings

RADIATION-SENSITIVE FILM COMPOSED OF AT LEAST ONE MONO-MOLECULAR LAYER OF FLUORINE-CONTAINING AMPHIPHILES

DESCRIPTION

The invention relates to a radiation-curable film composed of at least one monomolecular layer of organic polymers having long-chain side chains containing fluorine and oxiranes on a solid layer support (=so-called sandwiches), to a process for producing the sandwiches and curing them, optionally with structuring.

To produce ordered layers of organic polymers containing long-chain side groups, use is predominantly made of the Langmuir-Blodgett (LB) process. In this process, molecules are spread on a water surface and the long alkyl side groups are arranged in parallel by reducing the area per molecule. At constant shear, the molecules are drawn onto a substrate by immersion and emersion. In this process, a monomolecular layer is transferred in each immersion operation with its order being retained.

To build up LB films, use is made of amphiphilic molecules, i.e. molecules which have a hydrophilic end (a "head") and a hydrophobic end (a "tail"). There are also amphiphilic molecules in which perfluorinated alkyl chains act as hydrophobic units. In order to achieve a higher stability of the LB films, polymeric LB films, including also those having long-chain fluorine-containing side chains on a polymethacrylate or polyacrylate base have also already been prepared. Such films are described in the non-prior-published German Patent Application P 3,731,606.0. They exhibit a good order and low critical surface tension resulting therefrom, and these make them interesting, for example, for friction reduction applications. However, they can still be stripped, for example, by solvents and consequently lose their protective action. An application in microlithography is also not possible with the polymers described therein. The microstructuring of LB films with electron beams has already been described in various examples, including also even with oxirane-containing films, such as, for example, by B. Boothroyd, P. A. Delaney, R. A. Hann, R. W. Johnstone and A. Ledwith in Brit. Polym. J. 17, 360-363 (1985). There the electron-beam-induced polymerization of monomeric oxirane-containing amphiphiles in LB films is described. Structuring by crosslinking polymeric oxiranes has hitherto not yet been described in LB films.

The object was therefore to prepare synthetically easily accessible polymers which can be crosslinked by oxirane units and have nonpolar side chains and which can be satisfactorily transferred to a layer support.

The present invention achieves this object. It is based on the discovery that the products which can be obtained by copolymerization of vinyl monomers containing long-chain fluoroalkyl groups with vinyl monomers containing oxirane groups are good film formers. Owing to the fluorine-containing alkyl chains, a high etching resistance and a particularly low critical surface tension are obtained. The oxirane units are reactive and ensure the structurability. As polar units in the polymer, they should, in addition, take over the function of hydrophilic spacers which, as described, for example, by A. Laschewsky, H. Ringsdorf, G. Schmidt and J. Schneider in J. Am. Chem. Soc. 109, 788-796 (1987), make possible the different ordering tendencies of the polymer main chain (polymer coiling tendency) and the alkyl side chain (crystallization tendency) and consequently the achievement of ordered layers.

The copolymerization according to the invention proceeds particularly beneficially in solution under free-radical conditions, for example in tetrahydrofuran as solvent at 64° C. with 1% azobisisobutyronitrile as free-radical initiator and with monomer ratios of 1 mol of fluoroalkyl-containing monomer to 0.05 to 10 mol of oxirane-containing monomer.

The film according to the invention is composed of at least one monomolecular layer which contains an organic polymer having long-chain fluorinated alkyl side groups and oxirane units or is composed thereof. Suitable alkyl side groups are those of the formula I:

in which n is a number from zero to 23 and m is a number from zero to 24. Compounds in which n=5 to 11 and m=13 to 23 are particularly readily accessible. Compounds in which n+m=8 to 24 exhibit particularly beneficial amphiphilic properties.

The polymers are amphiphilic and contain, as polar group ("hydrophilic head group"), preferably at least one of the groups

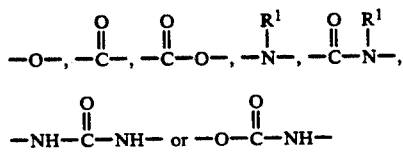

where $R^1$=H or a branched or unbranched alkyl chain containing 1-24, preferably 1-10, carbon atoms, which chain may optionally also be substituted by polar groups.

The oxirane units are preferably built into the polymer as comonomers. Particularly preferred comonomers are those of the formula II

where $R^2$ is a vinyl-group-containing radical, for example

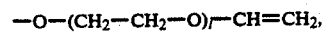

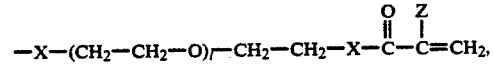

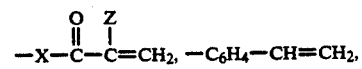

l is a number between zero and 10, X is —O— or —NH—. Z may be: —H, —(CH$_2$)$_l$—CH$_3$, —CF$_3$, —Cl, —F or —CN.

The comonomer may also contain more than one oxirane ring, as shown in the following example

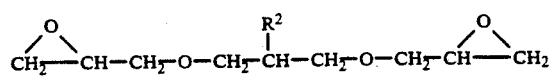

where $R^2$ has the meaning specified above.

As described in the unpublished European Patent Application 88,111,577.8, the adhesion of the individual monolayers to one another can be increased by an alternating sequence of monomolecular films containing fluorinated and unfluorinated alkyl chains. For this purpose, —CH$_3$ groups whose partial dipole moments are opposite with respect to the molecule must always be situated opposite the —CF$_3$ groups at the hydrophobic ends in the layer system. To achieve this, on the one hand, layer systems containing an alternating layer sequence A—B—A—B and, on the other hand, also layer systems containing alternating double layers A—A—B—B—A—A—B—B may be prepared, where A and B are layers containing fluorinated and unfluorinated alkyl groups at the hydrophobic ends.

To prepare a layer A, the organic polymers or mixtures according to the invention, which further contain, in addition, a second low-molecular-weight or high-molecular-weight amphiphilic compound in amounts of up to 99% by weight, preferably in amounts of 10–99% by weight, are dissolved in an essentially volatile solvent which is immiscible with water and transferred (=spread) onto the surface of an aqueous solution in a film balance. To prepare a layer B, a second low-molecular-weight or high-molecular-weight amphiphilic compound which is free of fluoroalkyl groups is analogously dissolved and spread.

The hydrophobic section of the second amphiphilic compound should have a certain minimum length. It is preferable if the second amphiphilic compound contains at least one hydrophobic section in which at least 8 carbon atoms are present and at least one of the following polar groups: an ether, hydroxyl, carboxylic acid, carboxylic acid ester, amine, carboxylic acid amide, ammonium salt, sulfate, sulfonic acid, phosphoric acid, phosphonic acid, phosphonic acid ester, phosphonic acid amide, phosphoric acid ester or phosphoric acid amide group.

It is particularly preferable if the amphiphilic compound is composed of at least one hydrophobic section containing at least 8 carbon atoms and at least one polar section which has been selected from the following groups:

—OR$^5$

—COOR$^3$

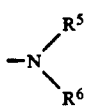

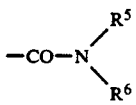

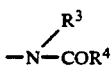

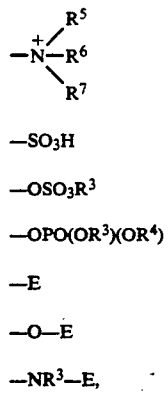

—SO$_3$H

—OSO$_3$R$^3$

—OPO(OR$^3$)(OR$^4$)

—E

—O—E

—NR$^3$—E, where R$^3$ to R$^7$, B and E are the following:
R$^3$ and R$^4$ are, independently of one another, H or C$_1$–C$_3$-alkyl,
R$^5$, R$^6$ and R$^7$ are, independently of one another, H, C$_1$–C$_4$-alkyl, —C$_2$H$_4$OH or —CH$_2$—CHOH—CH$_3$, in particular H or CH$_3$ B is a divalent organic radical so that —N B forms a nitrogen-containing heterocyclic compound, in particular a 5-membered or 6-membered saturated or unsaturated heterocyclic compound containing 1 to 3 carbon atoms or N and O atoms or N and S atoms, and is

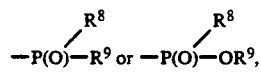

where R$^8$ and R$^9$ are, independently of each other,

For example, the amphiphilic compound may be a fatty acid of the formula CH$_3$(CH$_2$)$_g$CO$_2$H, where g is a number from 8 to 25, preferably 12 to 22.

Advantageously, an unsaturated acid amide of the formula III

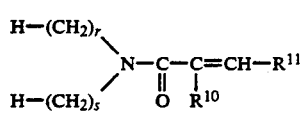

(III)

in which
R$^{10}$ is H, Cl, F, CN or (CH$_2$)$_t$H,
R$^{11}$ is H, (CH$_2$)$_u$H or —CH=CH—(CH$_2$)$_u$H,
r and s are, independently of each other, a number from 0–22 and
t and u are, independently of each other, a number from 0–24, in particular 0–18,
r is preferably a number from zero to 18 and s is preferably zero,
is used as second amphiphilic compound.

The second amphiphilic compound used is particularly preferably a polymer which can be prepared, for example, by copolymerization of a long-chain substituted unsaturated monomer, for example of the formula IV

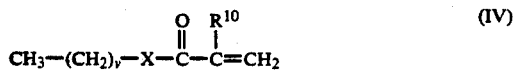

in which
X=—O—, —NH—
and $9 \geq v \geq 24$
and $R^{10}$ has the meaning specified above,
or of an amide according to formula III (with $r>0$ and $s>0$) with a polar unsaturated monomer (in particular without an alkyl group containing 11 or more carbon atoms), for example of the formula V

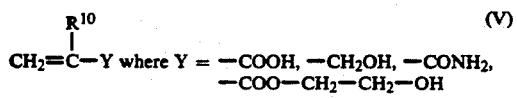

or with an oxirane-containing monomer according to formula II.

Normally the films and the monomolecular layers are prepared by means of the LB technique on water surfaces. It is therefore preferable if the amphiphilic compound only has a slight water solubility, in particular a water solubility of less than 5 g/l at 20° C.

In order to achieve an adequately low water solubility of said amphiphilic compound, it is preferable that at least one of the values for r, s, t and u is at least 10. It is not, however, necessary that all the values are at least 10. A particularly preferred possibility is that one of the values for t and u is at least 10 and the other value is a maximum of 1. Another particularly preferred possibility is that the value for r is at least 10 and the values for t and u are a maximum of 1.

It is also possible to use saturated acid amides of the formula VI

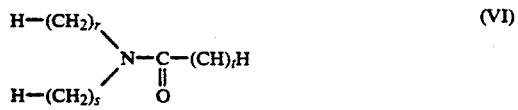

where r and s are, independently of each other, a number from 0 to 22 and t is a number from 0 to 24 and at least one of the values for r, s and t is at least 8, as amphiphilic compound.

Here again, to achieve an adequately hydrophobic nature, it is expedient for at least one of the values for r, s and t to be at least 10. A particularly preferred possibility is that the values for r and s are a maximum of 1 and the value for t is at least 10. Another particularly preferred possibility is that the value for r is at least 10 and the value for t is a maximum of 1.

It is beneficial if the chain lengths of the fluoroalkyloxirane polymer and of the second amphiphilic compound are matched to each other. It is therefore preferable that the length of the alkyl chain of the fluoroalkyloxirane polymer used and of the hydrophobic section of the second amphiphilic compound differ by a maximum of 1 nm. If the second amphiphilic compound should contain two or more hydrophobic sections, the longest hydrophobic section is decisive.

In the technique of film preparation described, the molecules are pushed together with a barrier, in which process the alkyl chains become oriented essentially perpendicularly to the boundary surface as the surface density increases. During the compression, a highly ordered monomolecular film whose constant layer thickness is essentially determined by the chain length of the alkyl side chains of the polymers and their tilt angle (that is the angle through which the molecule chains on the water surface are tilted with respect to the normal) is produced by self-organization of the molecules at the boundary surface. The typical thickness of such a film is 2-3 nm.

From the dimensions of the surface, the spreading volume and the concentration of the solution, the mean surface area per repeating unit can be calculated. Phase transitions during the compression of the molecules can be tracked in the shear-area isotherm.

The film is removed from the water surface at constant shear by immersion or emersion of a suitable carrier while maintaining the order.

Usually water or aqueous solutions are used as subphase for the monomolecular film preparation. However, other liquids having high surface tension such as, for example, glycerol, glycol, dimethyl sulfoxide, dimethylformamide or acetonitrile can also be used.

Any solid, preferably dimensionally stable substrates of various materials are suitable as supports The substrates acting as layer supports may, for example, be transparent or translucent, electrically conductive or insulating. The substrate may be hydrophobic or hydrophilic. The surface of the substrate on which the LB layer is deposited may be rendered hydrophobic. The surface of the substrate to be coated should be as clean as possible so that the development of a thin ordered layer is not hampered. In particular, the presence of surface-active substances on the surface of the substrates to be coated may impair the layer preparation. It is possible to first provide the substrate used as layer support with an intermediate layer on the surface to be coated before the LB film is deposited in order, for example, to improve the adhesion of the film to the substrate.

As materials for the substrate use may be made, for example, of metals such as, for instance, gold, platinum, nickel, palladium, aluminum, chromium, niobium, tantalum, titanium, steel and the like. Other suitable materials for the substrate are plastics such as, for example, polyesters, for instance polyethylene terephthalate or polybutylene terephthalate, polyvinyl chloride, polyvinylidene chloride, polytetrafluoroethylene, polystyrene, polyethylene or polypropylene.

Semiconductors such as silicon, germanium or gallium arsenide or, alternatively, glass, silicon dioxide, ceramic materials or cellulose products are equally suitable for the substrates. The surface of glass and other hydrophilic substrates may, if necessary, be rendered hydrophobic in a manner known per se by reaction with alkylsilanes or hexamethyldisilazane. The choice of substrate materials depends primarily on the application purpose of the sandwiches prepared from the film according to the invention. For optical components, use is made as a rule of transparent, translucent substrates as layer supports. If the sandwiches according to the invention are used, for example, in electronics or in electrochemical processes, in particular electrically conductive materials such as metals or metallic surface layers, for example on plastic films or glass, are used as substrates.

Depending on the application purpose, the substrates used as supports for the films according to the invention may have any desired shapes. For example, they may be film-like, sheet-like, plate-like, strip-like or even cylindrical, or be selected from any desired shapes In general, the layer supports will be flat, level substrates such as, for example, films, sheets, plates, strips or the like. The surface to be coated of the substrate is preferably smooth as is normal for preparing LB films. In the case of flat, level substrates, the films according to the invention may be deposited on one or both surfaces of the substrate.

The polymers according to the invention are remarkable for a good producibility of a multilayer structure having few defect points, the layer structure having a good temperature stability. The stability of the films can be increased by crosslinking of the polymer chains. This crosslinking may be induced, for example, by the action of UV light or electron beams, or alternatively by other types of ionizing radiation. The crosslinking reaction may also be locally initiated for the purpose of writing small structures with the aid of an electron beam writing unit, embodiments with and without mask being known to the person skilled in the art. The crosslinked points are, in contrast to the uncrosslinked ones, insoluble in polar and nonpolar solvents, so that a structured film can be obtained on a support by using solvents.

Such films on substrates are suitable, for example, for optical waveguide systems or for producing filters for optical purposes. Owing to the low critical surface tension, the films are also suitable for improving the frictional properties of materials, for producing protective layers and also for further appropriate applications.

The invention is explained in more detail by the following examples.

EXAMPLE 1

Free radical copolymerization of 1H,1H,2H,2H-perfluorododecyl N-(methacryloxyethyl)carbamate with glycidyl acrylate 2.00 g of 1H,1H,2H,2H-perfluorododecyl N-(methacryloxyethyl)carbamate and 1.78 g of glycidyl acrylate are dissolved in 20 ml of tetrahydrofuran and 4.6 mg of azobisisobutyronitrile are added. The solution is transferred to a three-neck flask with reflux condenser (with gas outlet tube and bubble counter), thermometer and gas inlet tube and flushed with nitrogen for one hour at room temperature. The mixture is then heated to reflux (internal temperature: 65° C.) and boiled under reflux for 8 hours. The reaction mixture is continuously stirred by means of magnetic stirrers and flushed with nitrogen. The polymer is precipitated by pouring the reaction solution into hexane and is filtered off by suction while cooling with dry ice. 2.2 g of a white material which is insoluble in hexane and methanol and is soluble in mixtures of FHC 113 with hexafluoroisopropanol are obtained. The elemental analysis (43.3% C, 4.0% H, 29.4% F and 1.0% N) reveals a copolymer composition of 1 part of 1H,1H,2H,2H-perfluorododecyl N-(methacryloxyethyl)carbamate and 5 parts of glycidyl acrylate.

EXAMPLE 2

Layer preparation by the Langmuir-Blodgett method

A glass microscope slide (76 mm × 26 mm) is cleaned by the following process:

The glass is placed for one hour in a freshly made-up mixture of four parts of concentrated $H_2SO_4$ and one part of 30% strength $H_2O_2$ at 60° C., rinsed off with clean water and treated at 50° C. with ultrasound for 15 minutes in a cleaning solution (®Extran AP 11, concentration 2–4 g/l). Then the slide is again rinsed off thoroughly with clean water and dried in a hot air stream. A treatment with hexamethyldisilazane vapor (10 minutes at 70° C.) is then carried out to render it hydrophobic.

Multilayers of the polymer prepared in Example 1 are transferred to the glass support by the Langmuir and Blodgett process by spreading 0.2 $cm^3$ of a solution of 5 mg of the polymer in 10 $cm^3$ of a mixture of 9 parts of FHC 113 and 1 part of hexafluoroisopropanol on an aqueous subphase at a subphase temperature of 30° C. in a Langmuir film balance. The shear is adjusted to 20 mN/m by reducing the water surface covered with the monomolecular film and kept constant at this value. The support is now immersed perpendicularly from above through the water surface into the film balance (immersion speed: 20 mm/min) and after a short pause (10 sec) at the lower reversal point is removed again (emersion speed: 10 mm/min). A monolayer is transferred to the support in this process both during the immersion and during the emersion operation. A total of 10 double layers are transferred by repeating the immersion operation several times after a waiting time of one minute each time at the upper reversal point. The transfer ratios are 90%. Optically clear, transparent layers are obtained.

EXAMPLE 3

Preparation of alternating layers of fluorine-containing and non-fluorine-containing amphiphiles by the Langmuir-Blodgett method A glass support is cleaned as in Example 2 and coated as in Example 2 with 2 monolayers of the copolymer prepared in Example 1. Then two monolayers of a 1:1 copolymer of hexadecyl methacrylate and acrylic acid are transferred on a second film balance (temperature of the subphase 30° C., shear 25 mN/m, immersion speed: 20 mm/min, emersion speed: 10 mm/min) by the Langmuir and Blodgett method. Following this, 2 monolayers of the fluorine-containing and then again two monolayers of the non-fluorinated polymer are again transferred until a total of 10 monolayers have been transferred. The transfer ratios are 98%. Optically clear transparent layers are obtained even if 20 or more monolayers are transferred.

EXAMPLE 4

Measurement of the critical surface tension

A silicon platelet (40 mm × 10 mm) is cut out of a silicon wafer and cleaned as follows:

1. Treatment for 1 hour in a hot (60° C.), freshly made-up mixture of one part of 30% strength $H_2O_2$ and 4 parts of concentrated $H_2SO_4$. It is then rinsed off with clean water.
2. Immersion for 30 seconds in $NH_4F$-buffered HF solution, followed by rinsing off again with clean water.

After this treatment, the silicon platelets are hydrophobic (water contact angle 75°).

The silicon platelet cleaned in this way is coated as in Example 2 with four monolayers of the polymer prepared as in Example 1.

Liquid drops of a series of n-alkanes ($C_6H_{14}$—$C_{16}H_{34}$) are placed on the surface of the transferred layers and the contact angles between the liquid drops and the surface are measured. The critical surface tension is determined from these contact angles by the Zisman method. A value of 12.4 mN/m is obtained. (For comparison: a value of 31 mN/m is obtained for a polyethylene surface in this measurement).

EXAMPLE 5

Structuring with electron beams

A silicon platelet is cleaned as described in Example 4 and coated as described in Example 3 with a total of 20 monolayers of the polymer prepared in Example 1 and a 1:1 copolymer of hexadecyl methacrylate and acrylic acid.

A strip pattern was written in the layer with a scanning electron microscope using a pattern generator with various energy doses in the range from 20 to 800 $\mu C/cm^2$. The pattern was developed by immersion for 30 seconds in a mixture of 9 parts of FHC 113 and one part of hexafluoroisopropanol. The result obtained was that from a dose of 100 $\mu C/cm^2$ upwards, the structures were completely resistant to the developer and had a good edge sharpness.

We claim:

1. A layer element comprising a film of an amphiphilic polymer which contains hydrophobic fluoroalkyl chains of the formula $$CF_3(CF_2)_n(CH_2)_m,$$

where n is 0 to 23 and m is 0 to 24 and m+n is 8 to 24 and oxirane radicals, the film being deposited on a solid support, the improvement comprising that the film is composed of at least one monomolecular ordered layer of the polymer.

2. A process for curing the film as claimed in claim 1, deposited on the support, which comprises allowing high-energy radiation to act on the film until the oxirane rings have been cleaved.

3. The process as claimed in claim 2, wherein the film is partially protected from the radiation by a structured mask and the nonirradiated film portions are removed by means of a solvent after completing the irradiation, a structured film remaining behind on the solid support.

4. The process as claimed in claim 2, wherein the film is structured by electron bombardment in an electron beam writing unit.

5. A process for preparing a layer element as claimed in claim 1, which comprises dissolving at least one polymer which has hydrophobic fluoroalkyl chains of the formula $CF_3(CF_2)_n(CH_2)_m$, where N=0 to 23 and m=0 to 24 and m+n =8 to 24 and oxirane radicals, in a volatile organic solvent which is immiscible with water, thus forming a solution, spreading the solution on an aqueous subphase in a Languir film balance, evaporating the solvent from the solution spread on the aqueous subphase in the Langmuir film balance, thus leaving a monomolecular layer on a water surface, compressing this layer and transferring the layer to a solid layer support by immersion and emersion of the solid support into the aqueous subphase.

6. A layer element comprising a film containing an amphiphilic polymer (A) which contains hydrophobic fluoroalkyl chains of the formula $CF_3(CH_2)_n(CH_2)_m$, where n=0 to 23 and m=0 to 24 and m+n=8 to 24 and oxirane radicals, wherein the film consists of a plurality of monomolecular layers of the polymer A and a plurality of monomolecular layers of a second amphiphilic compound B which is free of fluoroalkyl groups, the layers of A and B being arranged in alternating manner A—B—A—B and the film being deposited on a solid support.

7. A layer element comprising a film containing an amphiphilic polymer (A) which contains hydrophobic fluoroalkyl chains of the formula $CF_3(CH_2)_n(CH_2)_m$, where n=0 to 23 and m=0 to 24 and m+n =8 to 24 and oxirane radicals, wherein the film consists of a plurality of monomolecular layers of the polymer A and a plurality of monomolecular layers of a second amphiphilic compound B which is free of fluoroalkyl groups, the layers of A and B being arranged in the manner A—A—B—B—A—A—B—B and the film being deposited on a solid support.

* * * * *